(12) United States Patent
Ball et al.

(10) Patent No.: US 7,859,809 B2
(45) Date of Patent: Dec. 28, 2010

(54) TEST PLUG WITH OVERVOLTAGE PROTECTION

(75) Inventors: Roy Ball, Coral Springs, FL (US); Russ Gonnam, Coral Springs, FL (US); Cristine Luong, Coral Springs, FL (US)

(73) Assignee: ABB Technology AG, Zurich (CH)

( * ) Notice: Subject to any disclaimer, the term of this patent is extended or adjusted under 35 U.S.C. 154(b) by 326 days.

(21) Appl. No.: 12/209,402

(22) Filed: Sep. 12, 2008

(65) Prior Publication Data

US 2010/0067157 A1    Mar. 18, 2010

(51) Int. Cl.
*H02H 7/04*    (2006.01)
(52) U.S. Cl. ........................ 361/91.1; 361/35
(58) Field of Classification Search ........... 361/35, 361/38, 91.1, 111
See application file for complete search history.

(56) References Cited

U.S. PATENT DOCUMENTS

| | | | | |
|---|---|---|---|---|
| 4,521,822 A | * | 6/1985 | Simard | 361/35 |
| 5,270,658 A | * | 12/1993 | Epstein | 324/424 |
| 7,561,396 B2 | * | 7/2009 | Song | 361/93.5 |

* cited by examiner

*Primary Examiner*—Danny Nguyen
(74) *Attorney, Agent, or Firm*—Michael M. Rickin; Michael C. Prewitt

(57) ABSTRACT

A test plug for use with protective relays has a circuit that when it detects an overvoltage on the secondary side of a current transformer limits the overvoltage amplitude and the occurrence of the overvoltage to a predetermined number of peaks that are less than all of the peaks that occur when the secondary side is open circuited and the test plug is connected to the relays. The test plug also ensures that there is a continuous flow of current in the relays. The test plug further that has an indicator visible external to the plug to indicate the occurrence of an open circuit transformer secondary and that indicator remains illuminated when the test plug is disconnected from the protective relays.

20 Claims, 8 Drawing Sheets

TEST PLUG WITH OVERVOLTAGE PROTECTION

FIELD OF THE INVENTION

This invention relates to test plugs used with protective relays and more particularly to providing protection against the overvoltages and other conditions that occur during an unplanned opening of a current transformer.

DESCRIPTION OF THE PRIOR ART

Protective relays are devices designed to protect the electrical power system during disturbances. To accomplish their functions they take signals from the power system mainly by way of two types of devices, the potential transformer and current transformers.

Potential transformers convert high voltage levels down to low levels. Current transformers convert high current levels to low current levels. The lower level signals are then read by devices like protective relays and demand meters.

It is well known in the industry that current transformers have a unique operating characteristic. If the current transformer is operating under load (current flowing in the primary) and the low level secondary side circuit is opened, high voltages develop at the current transformer secondary terminals which can be dangerous or fatal to operators and may damage devices connected to the current transformer circuits.

The opening of a current transformer secondary side circuit could happen because of an accidental disconnection, incorrect test setup, defective equipment and leads, or when measuring the current the demand meter has fuse protection and the fuse operates to leave the circuit open.

To facilitate maintenance and testing, test switches are usually installed between the current transformers and the protective and control devices which may for example be relays. FIG. 1 shows the typical circuit 10 that connects the current transformer 12, and the protection and control devices 14 which in this instance is a relay. The test switch 16 is between the transformer 12 and the relay 14. The arrows show the flow of current in the circuit 10. The test switches 16 along with the use of test plugs as shown in FIG. 2, described below, facilitate access to the electrical connections of both the protective relays 14 and demand meters (not shown in FIG. 1).

FIG. 2 shows a test plug 18 inserted in the test switch 16 of FIG. 1 and a meter 20 connected to the test plug 18. The purpose of the test plug 18 is to facilitate measurement, calibration and troubleshooting. Inserting the test plug with the relay staying in service diverts the current to pass through the test plug allowing the meter to take the measurement while keeping the relay in service.

FIG. 3 shows an example of an unplanned opening of the current transformer circuit 10. In this example, the leads from the test plug 18 to the meter 20 are disconnected, but other conditions could cause the current transformer circuit to open. There is no current flow and a high voltage is developed at the secondary of the current transformer 12 due to the opening of the current transformer circuit. This high voltage can be several thousands of volts and has been measured in some instances as high as 15 kV. With this high voltage there is a safety concern for the user of the test switch 18 and meter 20 and a reliability concern for the equipment connected to the transformer which in this example is a relay. Also, the lack of current flow causes an incorrect interpretation by the protection and control equipment 14 of the true conditions on the power system. As a result of the incorrect information the protection and control equipment 14 could operate incorrectly or fail to operate when it is needed to operate.

Further the current transformer 12 may magnetize when its secondary side is open circuited. If the current transformer magnetizes it may still be magnetized when the open circuit is removed from the current transformer circuit. Thus the current flowing through the secondary may have an incorrect amplitude and an incorrect phase angle for that current.

The prior art provides overvoltage protection against the unplanned opening of current transformers in the test plug and meter section of the circuit. This is accomplished by continuous monitoring of the voltage levels. If an overvoltage condition is developed an electronic component is always placed in parallel with the main current path. In response to the overvoltage condition, the electronic component switches on bypassing the open circuit, restoring the current flow and eliminating the overvoltage conditions. Thus the prior art limits the voltage to safer levels of under 100 volts.

As the voltage goes down from the voltage present upon the occurrence of an overvoltage condition to safer levels and the current flow is restored via the electronic switching device, there is less danger for the users of the test plug. The new NFPA 70E standards state that any voltage above 48 volts should be carefully analyzed and where required the user should wear personal protective equipment. OSHA says that 50 Vac is a hazard [see 29 CFR 1910.333(a) (1) and 1910.269 (I) (1)] and the IEC (International Electrotechnical Commission) says that a hazard is 30 Vac RMS, 42 VAc peak, or 60 VDC.

When the alternating current flow crosses a zero value the prior art electronic switching device turns off eliminating the bypass of the open circuit. The current continues to flow in the primary (high side) of the current transformer. With the secondary of the transformer open circuited an overvoltage condition again develops across the secondary and the protection on the test plug once again limits the voltage to safer levels and the cycle continues to repeat until the test plug is removed from the circuit. Thus until the test plug is removed from the circuit, the user of the test plug is continuously exposed to voltages that may be dangerous.

While the prior art solution keeps the secondary voltages to safer levels, it does so by continuous on and off cycles. These cycles cause a lack of continuity of current to the protective relays and also negatively impacts the integrity of the current waveform as that waveform is distorted in the secondary of the current transformers. That lack of either continuity and integrity in the secondary current could be seen by some protective relays as a disturbance in the electrical power system, causing the protective relay to take the power system out of service.

SUMMARY OF THE INVENTION

A protective circuit for an electrical power system has:
 a transformer having primary and secondary sides for converting current at one amplitude flowing in the primary side to current of a lower amplitude flowing in the secondary side;
 a protective device;
 a test switch connected between the transformer secondary side and the protective device; and
 a plug for testing the circuit, the test plug inserted in the test switch so that the secondary side current flows through the test plug, the test plug has a circuit for closing the current transformer secondary side when the secondary side is open circuited, the closing circuit when closed maintaining a continuous flow of current through the protective device.

A protective circuit for an electrical power system has:

a transformer having primary and secondary sides for converting current at one amplitude flowing in the primary side to current of a lower amplitude flowing in the secondary side;

a protective device;

a test switch connected between the transformer secondary side and the protective device; and a plug for testing the circuit, the test plug inserted in the test switch so that the secondary side current flows through the test plug, the test plug has a circuit for closing the current transformer secondary side when the secondary side is open circuited, the closing circuit when closed limiting any overvoltage across the secondary side to less than all of the peaks of the current that flows when the secondary side is open circuited and the test plug is inserted in the test switch.

A plug for testing a protective circuit for an electrical power system, the protective circuit having a transformer with primary and secondary sides for converting current at one amplitude at the primary side to current of a lower amplitude at the secondary side, a protective device and a test switch connected between the transformer secondary side and the protective device, the test plug has:

a circuit for closing the current transformer secondary side when the secondary side is open circuited, the closing circuit when closed maintaining a continuous flow of current through the protective device.

A plug for testing a protective circuit for an electrical power system, the protective circuit having a transformer with primary and secondary sides for converting current at one amplitude at the primary side to current of a lower amplitude at the secondary side, a protective device and a test switch connected between the transformer secondary side and the protective device, the test plug has:

a circuit for closing the current transformer secondary side when the secondary side is open circuited, the closing circuit when closed limiting any overvoltage across the secondary side to less than all of the peaks of the current that flows when the secondary side is open circuited and the test plug is inserted in the test switch.

DETAILED DESCRIPTION

Figure 4A:
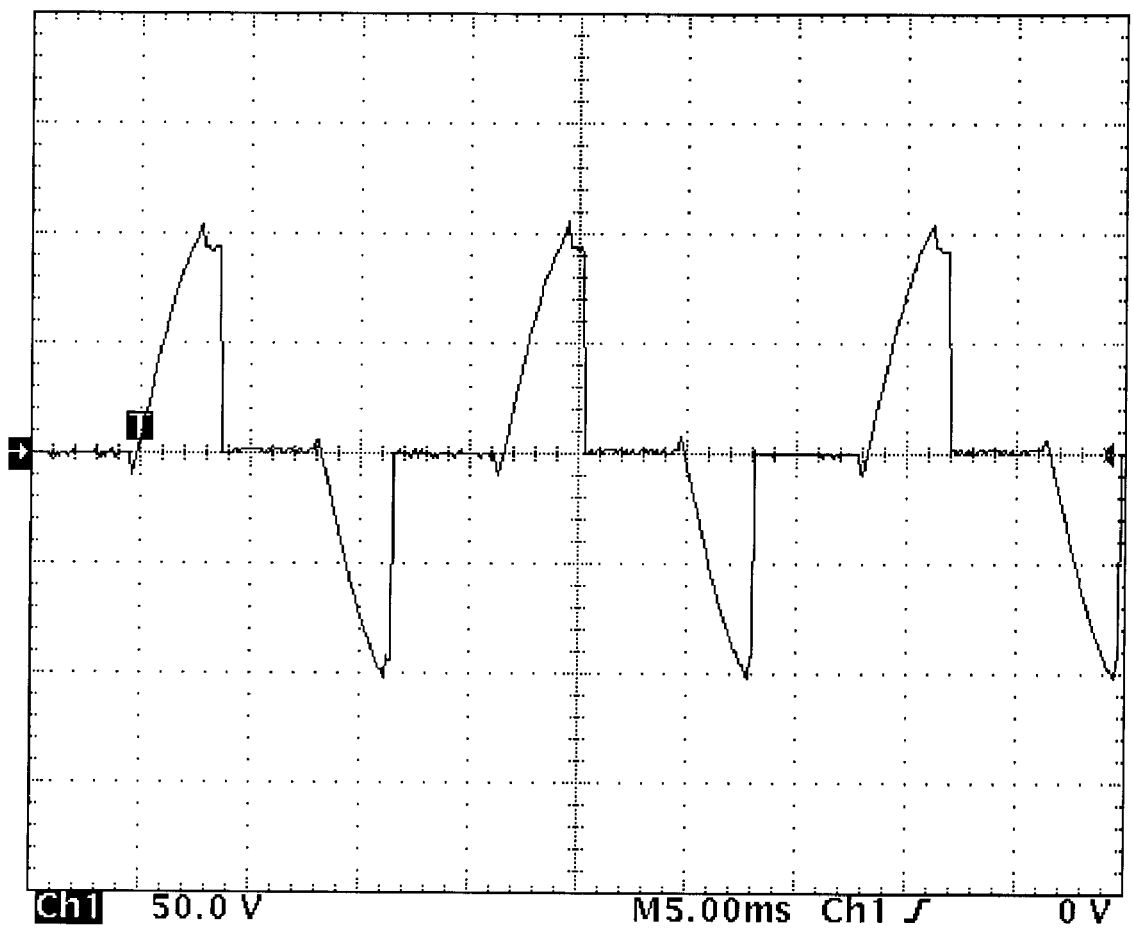
FIGS. 4a and 4b show an example of the voltage and current waveforms for the prior art test plug.
Figure 4B:
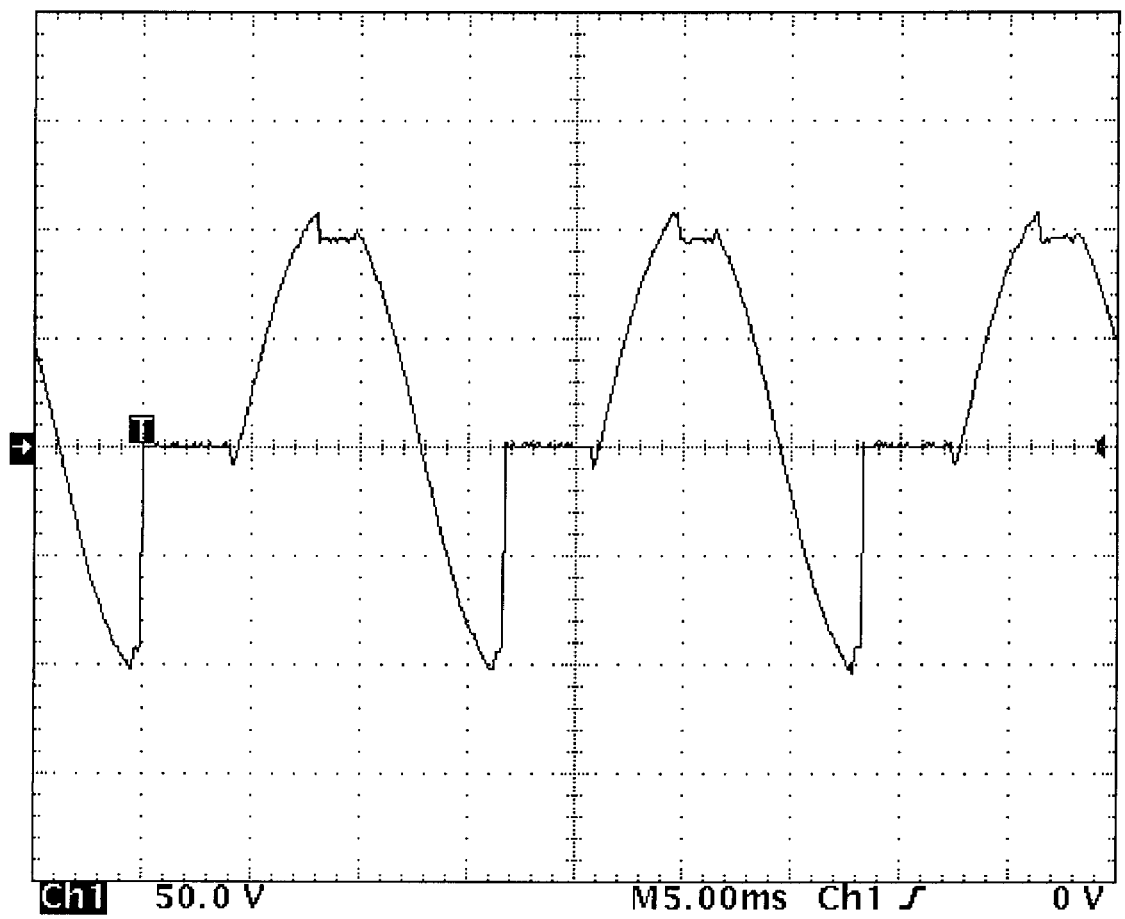
Figure 4C:
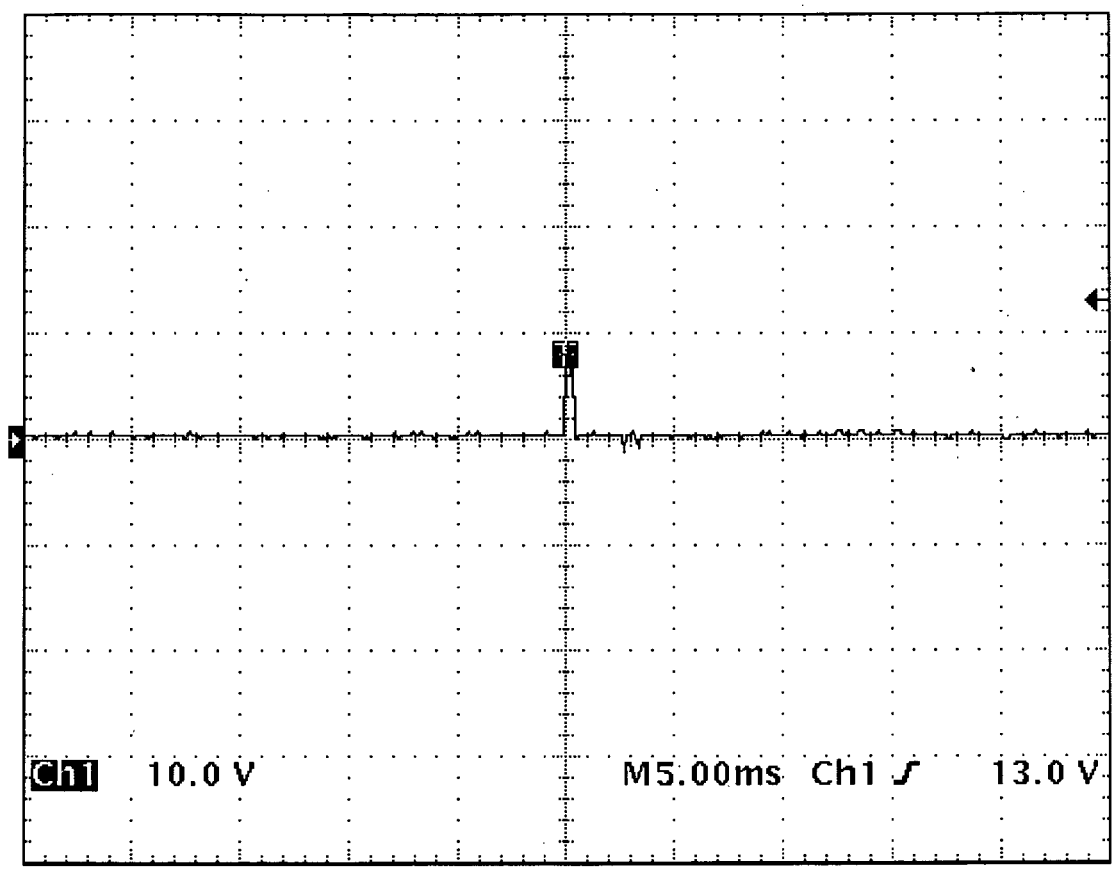
FIGS. 4c and 4d show the voltage and current waveforms for the test plug of the present invention.
Figure 4D:
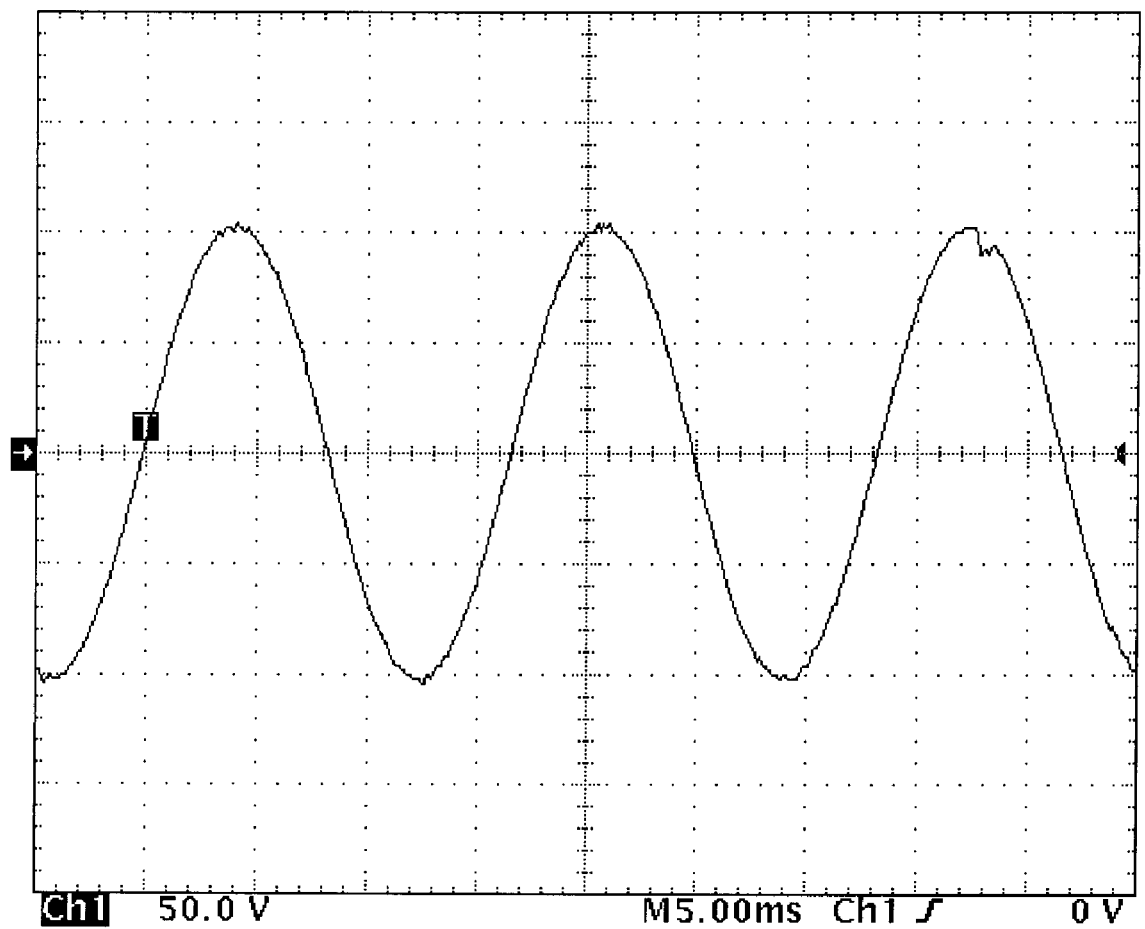

Referring now to FIGS. 4a to 4d, there are shown in FIGS. 4a and 4b an example of the voltage and current waveforms for the prior art solution and in FIGS. 4c and 4d the voltage and current waveforms for the present invention. FIG. 4a shows that the prior art solution limits the overvoltage peak amplitude in each half cycle to a maximum of 100 volts. Thus the user of a prior art test plug is exposed each half cycle of the AC voltage (every 8.33 millisecond for a voltage whose frequency is 60 Hertz) to an overvoltage peak amplitude having a 100 volt maximum.

In contrast thereto and as is shown in the overvoltage waveform in FIG. 4c, the test plug of the present invention substantially limits the amplitude of the overvoltage as compared to the prior art solution. Tests have shown that the test plug of the present invention limits the overvoltage peak amplitude to a maximum of 35 volts at the moment of the opening of the CT. As is shown in FIG. 4c, the overvoltage limiting by the test plug of the present invention is for one pulse only as thereafter the test plug of the present invention fully eliminates any overvoltage condition.

As can be seen by comparing the current waveform of the prior art solution shown on FIG. 4b with the current waveform in FIG. 4d for the test plug of the present invention, the present invention maintains the continuity and integrity of the current as compared to the prior art solution. Tests have shown that the test plug of the present invention may cause a minimal lack of continuity and integrity in the current waveform. These tests have also shown that if the lack of continuity and integrity does occur it is as is shown in FIG. 4d limited to the first half cycle while as can be seen in FIG. 4c providing continuous safe overvoltage protection for the end user of the test plug.

Thus the test plug of the present invention eliminates the possibility of relay misoperations at the same time that it provides safety to the user by eliminating the excessive voltage levels. This test plug eliminates or reduces the duration of the distortion in the current waveform to the first half cycle while providing continuous safe over-voltage protection for the end user and eliminates the lost signal condition.

Figure 2:
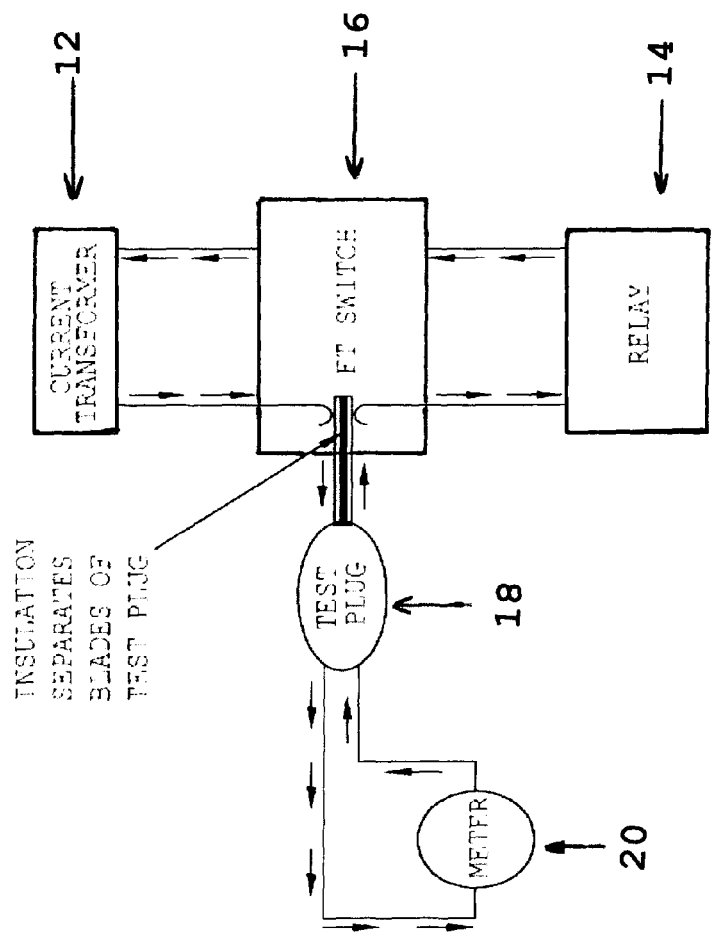
FIG. 2 shows a test plug inserted in the test switch of FIG. 1 and a meter connected to a prior art test plug.
Figure 1:
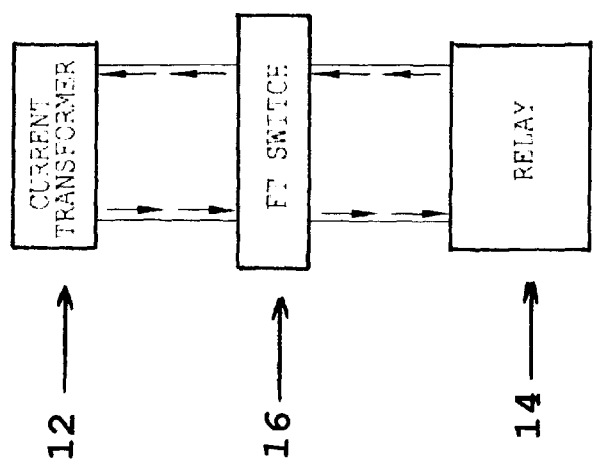
FIG. 1 shows the typical connection between the current transformer and the protection and control devices.
Figure 3:
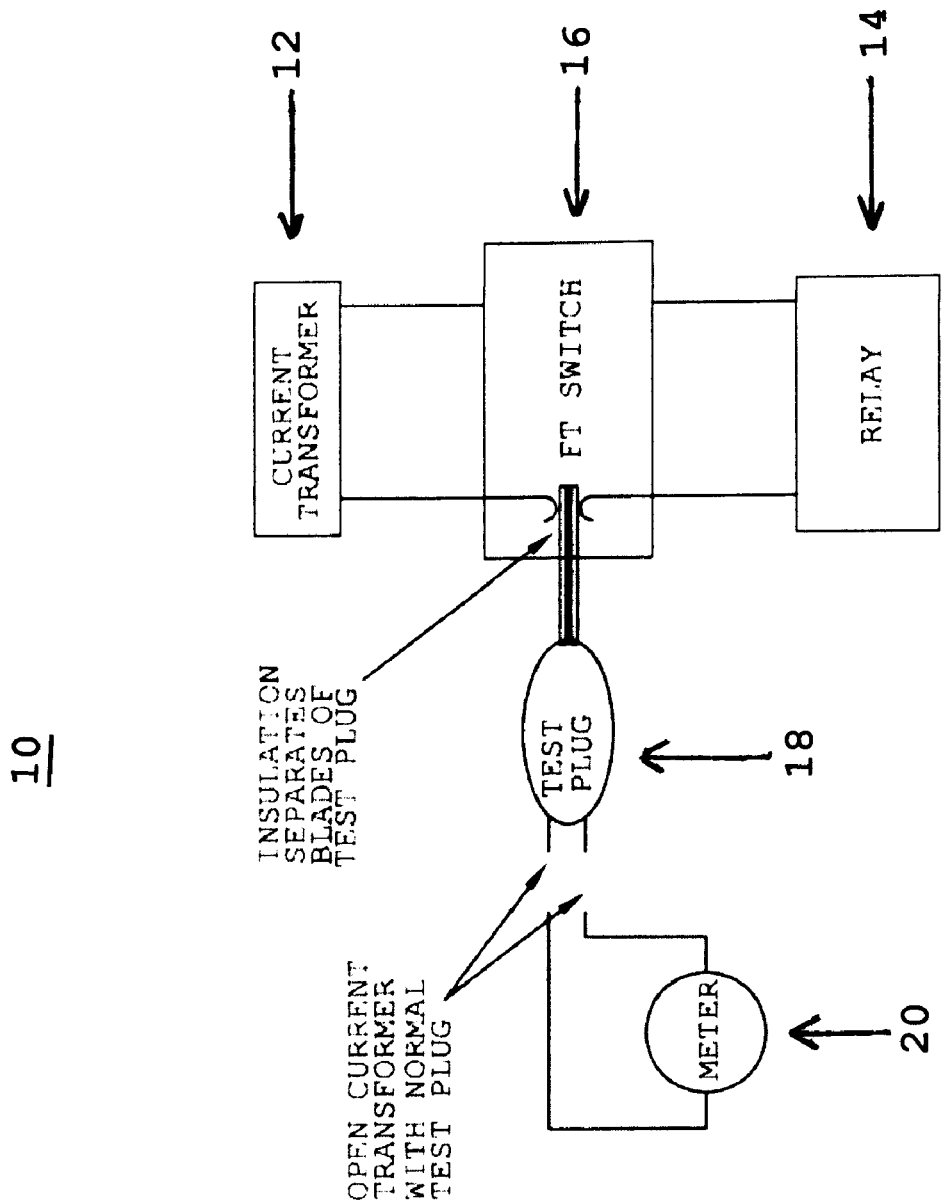
FIG. 3 shows an example of an unplanned opening of the current transformer circuit.
Figure 5:
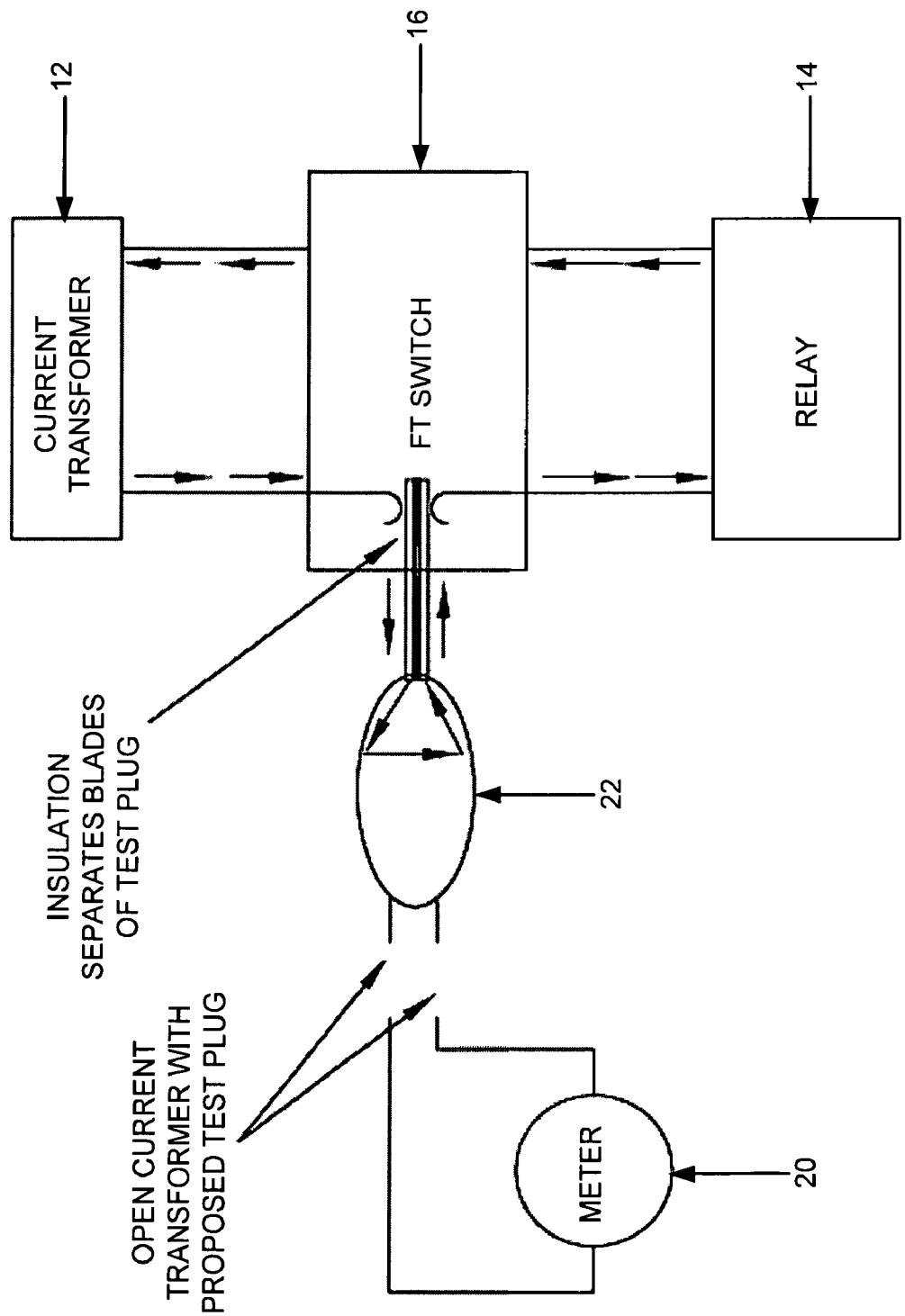
FIG. 5 shows the typical connection of the test plug of the present invention to the current transformer circuit.
Figure 6:
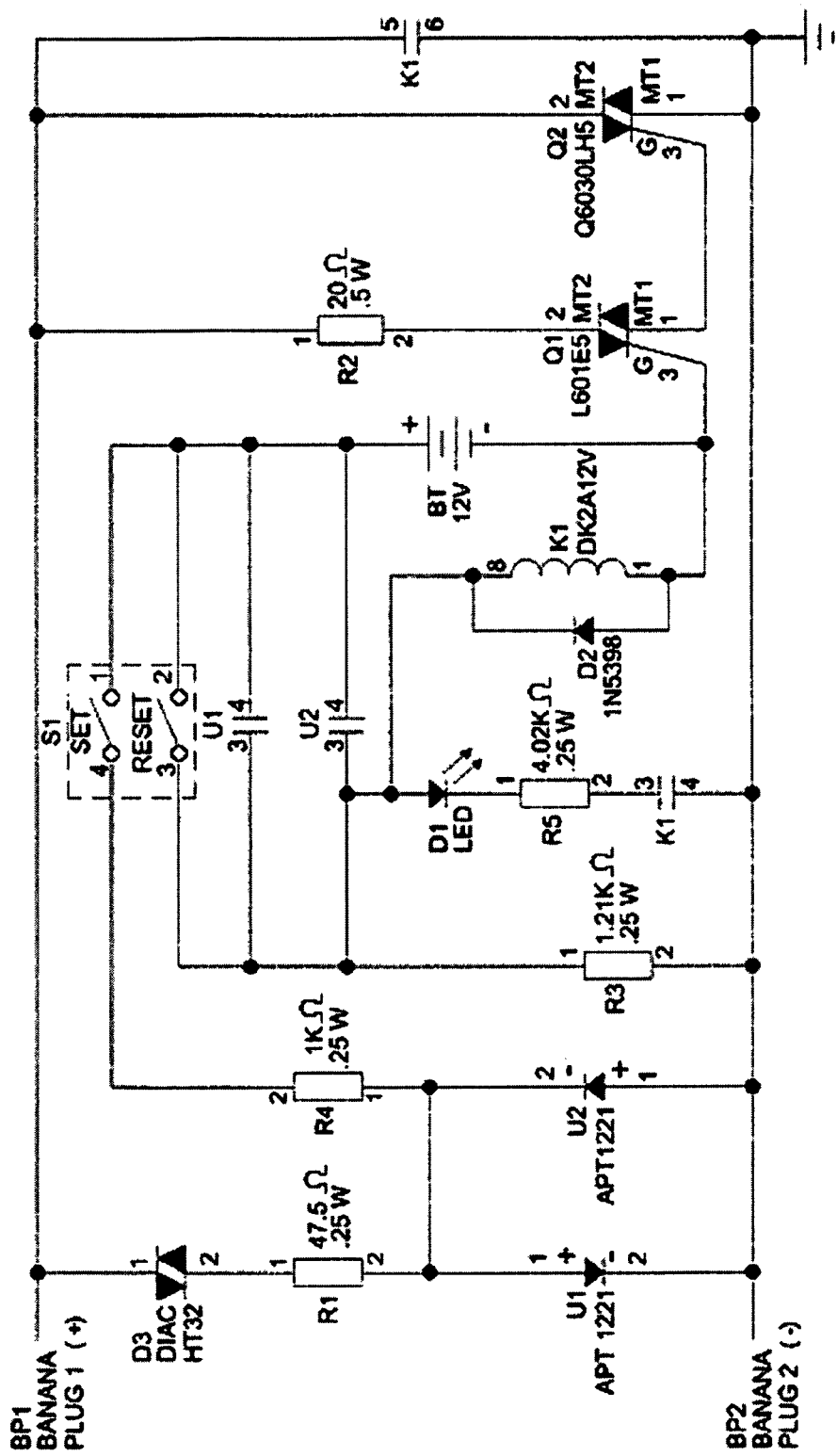
FIG. 6 shows a circuit schematic for one embodiment of the electronic circuit that is in the test plug of the present invention.

Referring now to FIG. 6, there is shown a circuit schematic for one embodiment of the electronic circuit that is in the test plug of the present invention. The test plug 22 of the present invention is typically connected as shown in FIG. 5 to the current transformer circuit in series. A current meter 20, also shown in FIG. 5, is used to monitor current levels and is connected to the connection points identified in FIG. 6 as banana plug 1 BP1 and banana plug 2 BP2. While FIG. 5 is identical to FIG. 3 described above, it should be appreciated that the test plug 22 shown in FIG. 5 is the test plug of the present invention.

Referring once again to FIG. 6, upon the occurrence of an unplanned opening of the current transformer (CT) secondary side, an overvoltage condition is developed across the test plug terminals BP1 and BP2. When the voltage level across terminals BP1 and BP2 exceeds the threshold value of diac D3, the current flows through resistor R1 and phototriac U1 or U2, depending on the instantaneous polarity of the voltage waveform. The phototriac U1 or U2 in turn closes contacts U1 or U2 terminals 3 and 4, allowing the circuit that includes battery BT to be completed and turn on the combination of triacs Q1 and Q2.

The turning on of Q1 and Q2 short circuits the current flow and thus "restores" the open CT circuit.

The battery BT also powers up a miniature power relay K1. The miniature power relay K1 closes its contacts and carries most of the current. This arrangement is used to eliminate the need for the extensive heat sink required for Q2 that would be needed for Q2 in the absence of relay K1. The arrangement also allows for a smaller package, less components and lower cost.

The battery BT also provides current to power up the LED indicator D1 after the relay K1 closes its contacts.

The LED indication remains on even after the test plug is removed from the open circuit. This shows that the circuit to which the plug was connected had an open CT secondary. If the test setup is unattended for some reason, the LED indication alerts the user of the condition upon his/her return.

Set and reset buttons collectively identified in FIG. 6 as S1 are provided to test the test plug 22 prior to each use. The testing shows that the circuit in the test plug 22 will function correctly if the CT secondary opens.

It should be appreciated that while FIG. 6 shows one embodiment for the circuit in test plug 22 that other embodiments for that circuit will accomplish the same result.

It is to be understood that the description of the foregoing exemplary embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A protective circuit for an electrical power system comprising:
    a transformer having primary and secondary sides for converting current at one amplitude flowing in said primary side to current of a lower amplitude flowing in said secondary side;
    a protective device;
    a test switch connected between said transformer secondary side and said protective device; and
    a plug for testing said circuit, said test plug inserted in said test switch so that said secondary side current flows through said test plug, said test plug comprising a circuit for closing said current transformer secondary side when said secondary side is open circuited, said closing circuit when closed maintaining a continuous flow of current through said protective device.

2. The protective circuit of claim 1 wherein said closing circuit comprises means responsive to said voltage across said transformer secondary circuit exceeding a predetermined voltage level indicative of an open secondary side for closing said open secondary side and maintaining a continuous flow of current through said protective device.

3. The protective circuit of claim 2 wherein said closing circuit further comprises means for determining when said voltage across said transformer secondary circuit exceeds a predetermined voltage level indicative of an open secondary side.

4. The protective circuit of claim 1 wherein said closing circuit comprises an indicator visible external to said test plug for indicating that said test plug is connected to an open circuit secondary side of said current transformer.

5. The protective circuit of claim 4 wherein said indicator is energized when said test plug is connected to an open circuit secondary side of said current transformer and said closing circuit further comprises means for keeping said indicator energized after said test plug is disconnected from said protective circuit.

6. A protective circuit for an electrical power system comprising:
    a transformer having primary and secondary sides for converting current at one amplitude flowing in said primary side to current of a lower amplitude flowing in said secondary side;
    a protective device;
    a test switch connected between said transformer secondary side and said protective device; and
    a plug for testing said circuit, said test plug inserted in said test switch so that said secondary side current flows through said test plug, said test plug comprising a circuit for closing said current transformer secondary side when said secondary side is open circuited, said closing circuit when closed limiting any overvoltage across said secondary side to less than all of the peaks of said current that flows when said secondary side is open circuited and said test plug is inserted in said test switch.

7. The protective circuit of claim 6 wherein said closing circuit comprises means responsive to said voltage across said transformer secondary circuit exceeding a predetermined voltage level indicative of an open secondary side for closing said open secondary side and limiting any overvoltage across said secondary side to less than all of the peaks of said current that flows when said secondary side is open circuited and said test plug is inserted in said test switch.

8. The protective circuit of claim 7 wherein said closing circuit further comprises means for determining when said voltage across said transformer secondary circuit exceeds a predetermined voltage level indicative of an open secondary side.

9. The protective circuit of claim 6 wherein said closing circuit comprises an indicator visible external to said test plug for indicating that said test plug is connected to an open circuit secondary side of said current transformer.

10. The protective circuit of claim 9 wherein said indicator is energized when said test plug is connected to an open circuit secondary side of said current transformer and said closing circuit further comprises means for keeping said indicator energized after said test plug is disconnected from said protective circuit.

11. A plug for testing a protective circuit for an electrical power system, said protective circuit having a transformer with primary and secondary sides for converting current at one amplitude at said primary side to current of a lower amplitude at said secondary side, a protective device and a test switch connected between said transformer secondary side and said protective device, said test plug comprising:
    a circuit for closing said current transformer secondary side when said secondary side is open circuited, said closing circuit when closed maintaining a continuous flow of current through said protective device.

12. The test plug of claim 11 wherein said closing circuit comprises means responsive to said voltage across said transformer secondary circuit exceeding a predetermined voltage level indicative of an open secondary side for closing said open secondary side and maintaining a continuous flow of current through said protective device.

13. The test plug of claim 12 wherein said closing circuit further comprises means for determining when said voltage across said transformer secondary circuit exceeds a predetermined voltage level indicative of an open secondary side.

14. The test plug of claim 11 wherein said closing circuit comprises an indicator visible external to said test plug for indicating that said test plug is connected to an open circuit secondary side of said current transformer.

15. The test plug of claim 14 wherein said indicator is energized when said test plug is connected to an open circuit secondary side of said current transformer and said closing circuit further comprises means for keeping said indicator energized after said test plug is disconnected from said protective circuit.

16. A plug for testing a protective circuit for an electrical power system, said protective circuit having a transformer with primary and secondary sides for converting current at one amplitude at said primary side to current of a lower amplitude at said secondary side, a protective device and a test switch connected between said transformer secondary side and said protective device, said test plug comprising:
    a circuit for closing said current transformer secondary side when said secondary side is open circuited, said closing circuit when closed limiting any overvoltage across said secondary side to less than all of the peaks of said current that flows when said secondary side is open circuited and said test plug is inserted in said test switch.

17. The test plug of claim 16 wherein said closing circuit comprises means responsive to said voltage across said transformer secondary circuit exceeding a predetermined voltage level indicative of an open secondary side for closing said open secondary side and limiting any overvoltage across said secondary side to less than all of the peaks of said current that flows when said secondary side is open circuited and said test plug is inserted in said test switch.

18. The test plug of claim 17 wherein said closing circuit further comprises means for determining when said voltage across said transformer secondary circuit exceeds a predetermined voltage level indicative of an open secondary side.

19. The test plug of claim 16 wherein said closing circuit comprises an indicator visible external to said test plug for indicating that said test plug is connected to an open circuit secondary side of said current transformer.

20. The test plug of claim 19 wherein said indicator is energized when said test plug is connected to an open circuit secondary side of said current transformer and said closing circuit further comprises means for keeping said indicator energized after said test plug is disconnected from said protective circuit.

* * * * *